United States Patent
Conte et al.

(10) Patent No.: US 7,649,786 B2
(45) Date of Patent: Jan. 19, 2010

(54) NON-VOLATILE MEMORY ARCHITECTURE AND METHOD, IN PARTICULAR OF THE EEPROM TYPE

(75) Inventors: Antonino Conte, Tremestieri Etneo (IT); Roerto Annunziata, Monza (IT); Paola Zuliani, Milan (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 268 days.

(21) Appl. No.: 11/701,165

(22) Filed: Jan. 31, 2007

(65) Prior Publication Data
US 2007/0247919 A1  Oct. 25, 2007

(30) Foreign Application Priority Data
Jan. 31, 2006  (EP)  ................... 06425047

(51) Int. Cl.
G11C 16/04  (2006.01)
(52) U.S. Cl. ............................. 365/185.27; 365/185.12
(58) Field of Classification Search ........ 365/185.12 X, 365/185.17, 185.27 O, 185.12, 185.27
See application file for complete search history.

(56) References Cited
U.S. PATENT DOCUMENTS

| | | | | |
|---|---|---|---|---|
| 5,986,931 A | * | 11/1999 | Caywood | 365/185.06 |
| 6,011,717 A | * | 1/2000 | Brigati et al. | 365/185.18 |
| 7,110,302 B2 | * | 9/2006 | Lee et al. | 365/185.33 |
| 7,286,401 B2 | * | 10/2007 | Ishimaru et al. | 365/185.11 |
| 2005/0052918 A1 | | 3/2005 | Dormans et al. | |
| 2005/0162910 A1 | * | 7/2005 | Lee et al. | 365/185.11 |
| 2005/0169052 A1 | * | 8/2005 | Hsu et al. | 365/185.03 |
| 2005/0185501 A1 | | 8/2005 | Lee et al. | |

OTHER PUBLICATIONS

European Search Report, EP06425047, Jul. 14, 2006.

* cited by examiner

*Primary Examiner*—VanThu Nguyen
(74) *Attorney, Agent, or Firm*—Lisa K. Jorgenson; Paul F. Ryan; Graybeal Jackson LLP (57) ABSTRACT

A memory architecture includes at least one matrix of memory cells of the EEPROM type organized in rows or word lines and columns or bit lines. Each memory cell includes a floating gate cell transistor and a selection transistor and is connected to a source line shared by the matrix. The memory cells are organized in words, all the memory cells belonging to a same word being driven by a byte switch, which is, in turn, connected to at least one control gate line. The memory cells further have accessible substrate terminals connected to a first additional line.

33 Claims, 4 Drawing Sheets

NON-VOLATILE MEMORY ARCHITECTURE AND METHOD, IN PARTICULAR OF THE EEPROM TYPE

PRIORITY CLAIM

This application claims priority from European patent application No. 06425047.5, filed Jan. 31, 2006, which is incorporated herein by reference.

TECHNICAL FIELD

Embodiments of the present invention relate to a non volatile memory architecture, in particular of the EEPROM type and also relate to a biasing method of a memory architecture to reduce the stresses of this memory components.

BACKGROUND

As it is well known, electrically erasable non volatile memory cells are nowadays widespread in several applications. Among them the cells of the EEPROM type show a particular importance, both for their capacity to be erased per single word and programmed per single bit, and for the extremely reduced current consumption in the read and modify modes (erasing/programming).

The use of EEPROM memories is nowadays particularly widespread for the applications onto electronic devices such as the so called Smart Cards, where these types of memories are used with great success.

Actually, the need of scaling down the physical dimension of these devices so as to reduce the costs and to be more competitive in the market of semiconductors, has pushed the physical dimension of the EEPROM cells to such a point as to lead to the physical limit the possibility of further reducing these dimensions, the malfunctioning of the devices themselves being the price.

This is essentially due to the physical principle upon which the operation of an EEPROM cell is based in the modify mode, which consists of applying high electrical fields (~10-12 MV/cm) onto the MOS transistor which realizes the cell and which has a thin dielectric capacitor structure (~7 nm) aimed at obtaining significant Fowler-Nordheim currents (~60 pA/cell) and at accumulating positive or negative charge on the floating gate terminal of the cell itself. An EEPROM memory cell in fact comprises, in a known way, a floating gate transistor, this floating gate region being realized above a tunnel oxide and overhung by a control gate electrode.

The Fowler-Nordheim mechanism requires, for the charge transfer, high voltage values, in the order of 12V, which cannot be scaled down due to the fact that the thickness of the cell tunnel oxide cannot be in turn reduced below a certain limit, and this is due to considerations linked to the reliability of the cell itself (the so called endurance with respect to programming/erasing cycles and charge retention).

The fact of having to impose these high voltage values particularly limits the possibility of scaling down the physical dimensions of the cell selector, i.e. a selection transistor associated with each EEPROM memory cell whose aim is that of insulating the cell when the cell is not selected and of allowing the passage of the biasing voltages on the modification of the cell state.

It is thus a high voltage (HV) transistor on whose control gate voltage up to 15V can be applied necessary to allow the passage of 12V on the drain terminal of the memory cell associated therewith, in turn realized by a floating gate transistor also called sensing transistor.

The EEPROM memory cells currently used in the industry of semiconductors for high density applications, such as the use on Smart Card devices, have a structure with a double polysilicon or poly layer and a cell selection transistor. The cells are designed so as to form words of a certain number of bits (for example 8 bits or 32 bits) which depend on the used parallelism. The control gate of these cells is then accessed by means of a corresponding word selection transistor (also called byte switch) which allows biasing the control gates of these cells both in reading and in erasing, or to insulate the same from the biasing voltages in case these cells are not selected.

Figure 1:
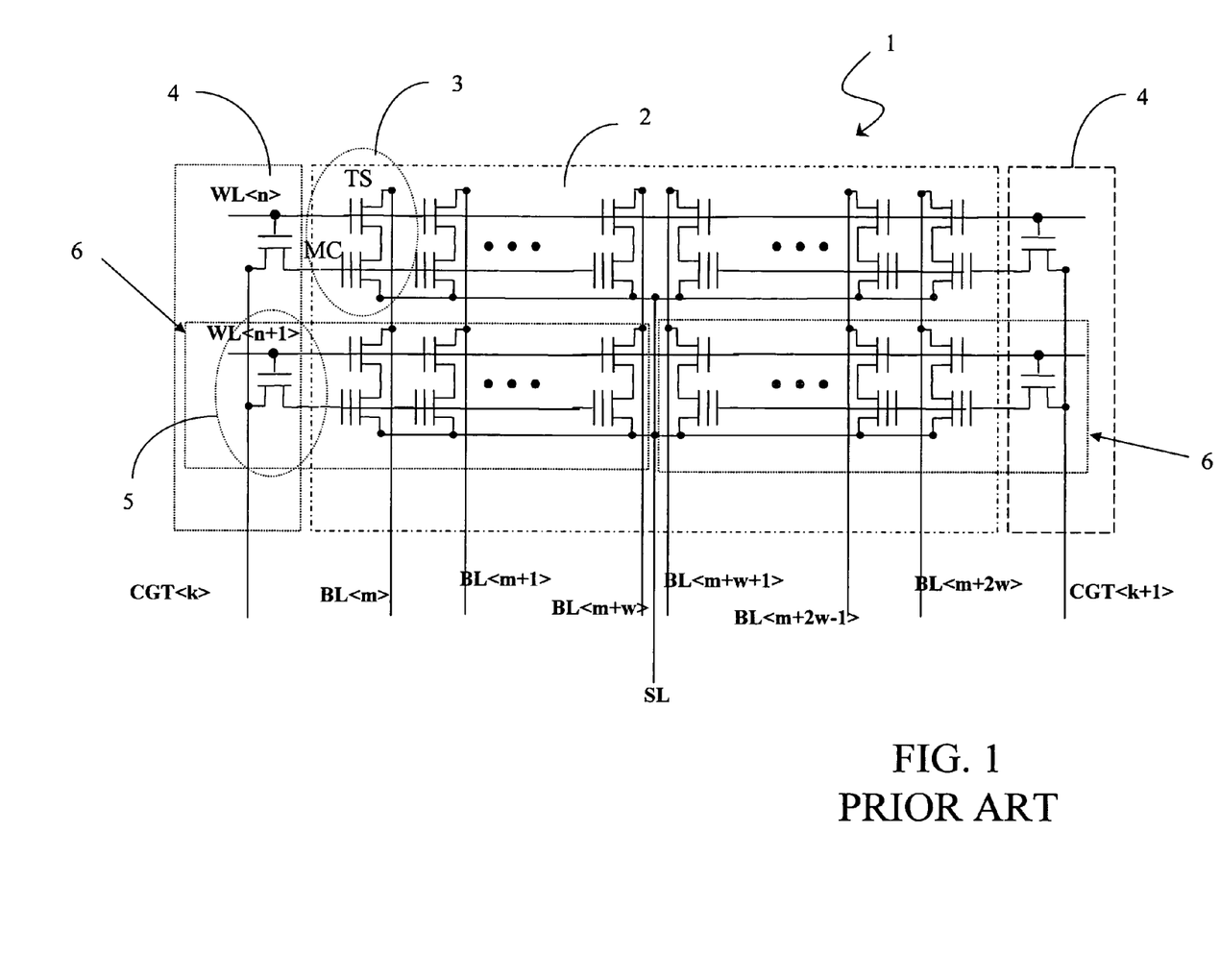
FIG. 1 schematically shows a memory architecture realized according to the prior art.

A memory architecture including a matrix of cells of the EEPROM type realized according to the prior art is schematically shown in FIG. 1 and globally indicated with a 1.

This memory architecture 1 comprises a matrix 2 of memory cells 3 of the EEPROM type, each comprising one sensing or cell transistor MC, i.e. a floating gate transistor constituting the real memory cell, and a cell selection transistor TS.

The EEPROM cells are organized in a matrix, in the example shown in a parallel architecture comprising an array of w bits.

The matrix 2 of cells is connected to a switch portion 4 comprising a plurality of byte switches 5. The byte switch is an element which allows the biasing of the control gate terminals of the memory cells in the various modify and read operations. The switch portion 4 is repeated symmetrically for the successive portions of the matrix 2.

The memory architecture 1 shows in fact a symmetrical structure with respect to a source line SL shared by the entire matrix 2.

In particular, the cell transistors MC belonging to a same word 6 have first conduction terminals, in particular drain terminals, connected to respective selection transistors TS, second conduction transistors, in particular source terminals connected to each other and to the source line SL and control or gate terminals connected to each other and to a respective byte switch 5 of the switch portion 4.

The byte switches 5 have first conduction terminals, in particular source terminals, connected to control gate terminals of the cell transistors MC of a same word 6, second conduction terminals, in particular drain terminals, connected to each other and to a control gate line CGT and control or gate terminals connected to the control or gate terminals shared by the selection transistors TS of the word 6 as well as to respective word lines WL. In this way, all the memory cells 3 belonging to a same word 6 are driven by a same byte switch 5.

Finally, the selection transistors TS have first conduction terminals, in particular drain terminal, connected to respective bit lines BL, second conduction terminals, in particular source terminals, connected to the cell transistors MC and control or gate terminals connected to the word lines WL.

In the architecture 1 as shown, the various programming, erasing and reading operations occur by using particular values for the signals applied onto the lines connected to the terminals of the cell MC and select TS transistors of the memory cells 3, selected (sel) or non selected (non sel), according to what is shown in the following table 1.

TABLE 1

| Line | Erasing operation | Programming operation | Reading operation |
|---|---|---|---|
| CGT sel | Ve | 0 V | Vr1 |
| CGT non sel | FLOAT | 0 V | 0 V |
| BL sel | FLOAT | Vp | Vr2 |
| BL non sel | FLOAT | FLOAT | FLOAT |
| WL sel | Ve + Vth bsw(Ve) | Vp + Vth sel(Vp) | Vr3 |
| WL non sel | 0 V | 0 V | 0 V |
| SL | 0 V | FLOAT | 0 V | being:

CGT, BL, WL and SL the control gate, bit, word and source lines respectively;

Ve, Vp erase and program voltage values, respectively;

Vth bsw(Ve) and Vth sel(Vp) threshold voltage values of the byte switch and selection transistors, under conditions of body effect equal to the erase and program voltages, respectively; and Vr1, Vr2 e Vr3 read voltage values, normally equal to about 1V, 0.8V and 5V.

The word FLOAT also indicates when no biasing voltage is applied onto the corresponding line.

During the programming operation electrons are extracted from the floating gate until a first threshold voltage is obtained lower than a first level UV (state devoid of charge) suitable for coding a first logic level, or logic "1". During the erasing operation, there occurs, in a dual way, an injection of electrons into the floating gate until a second threshold voltage is obtained higher than this first level UV to code a second logic level, or logic "0".

As it is evident from the biasing voltages at stake, in the modifying operations of the charge contained in the floating gate of the cells (programming and erasing), the stress condition to which the various terminals of the cells are subjected are such as to impose a strong limitation to the possibility of scaling down the physical dimensions of the same.

In particular, it is remarked that:

1) It is necessary to maintain the right distance between the active areas of the cell and selection transistors, to allow an efficient insulation between the bit lines against the field parasite transistor (which has a voltage value equal to the word line voltage (i.e. Ve+Vthsel(Ve) applied onto its gate terminal).

2) The minimum length of the selection transistor which serves as cell selector cannot be reduced below a certain limit due to the fact that, during the programming operations, on the drain terminal of this selection transistor a voltage must be applied equal to the programming voltage Vp, and the selection transistor must however ensure the insulation of cells which do not have to be programmed. Under these conditions there has not to be any current induced by high voltages onto its drain terminal.

3) The width of the selection transistor can be reduced only within certain limits, to avoid a significant degradation of the gain of the transistor itself and a subsequent strong limitation of the current necessary in the reading operations.

4) The voltages applied onto the lines of the memory cells should however be maintained around a value equal to ~12V to ensure a correct programming of the cells, since it is not possible to reduce the thickness of their tunnel oxide not to go below the limit imposed by the requisites linked to the reliability of the memory.

It can thus be understood how these constraints impose a physical limit to the possibility of scaling down the minimum dimensions of an EEPROM cell of a memory architecture realized according to the prior art.

SUMMARY

An embodiment of this invention is directed to a memory architecture able to ensure a correct biasing of the memory cells contained therein during the different state modifying and reading operations, reducing the stresses on the elements of the memory architecture and thus overcoming the limits and the drawbacks still affecting memory architectures realized according to the prior art.

The matrix portion and the switch portion of the memory architecture are realized in insulated wells, thus making the respective substrate terminals accessible.

The characteristics and the advantages of the memory architecture according to embodiments of the invention will be apparent from the following description of embodiments given by way of indicative and non limiting example with reference to the annexed drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 2:
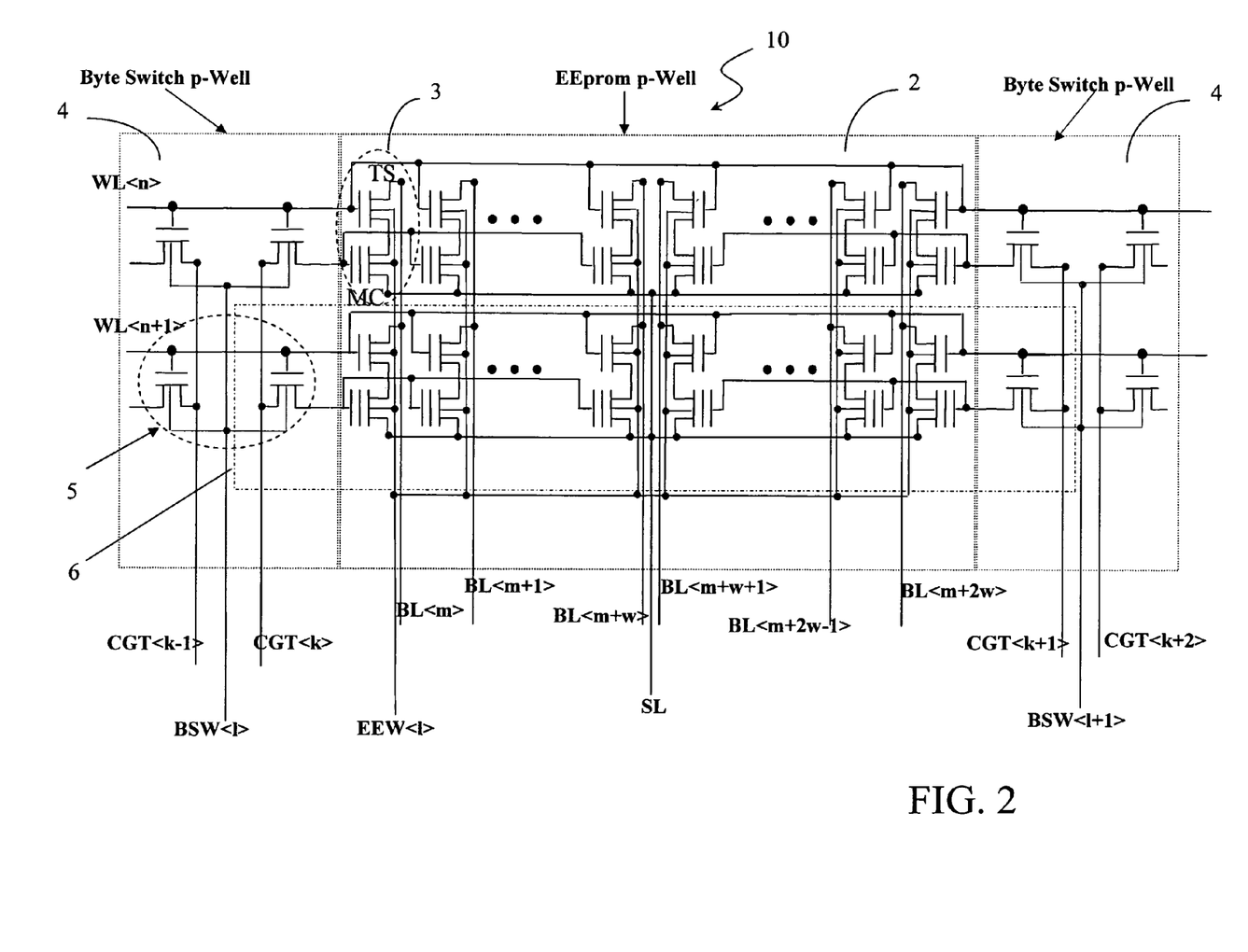
FIG. 2 schematically shows a memory architecture realized according to an embodiment of the invention.

With reference to FIG. 2, a memory architecture is described being realized according to an embodiment of the present invention, globally and schematically indicated with 10.

Elements being structurally and/or functionally identical to the memory architecture 1 described with reference to the prior art and shown in FIG. 1 will be given the same reference numbers for sake of simplicity.

The memory architecture 10 thus comprises a matrix 2 of memory cells 3 of the EEPROM type, each comprising a sensing or cell transistor MC, i.e. a floating gate transistor constituting the real memory cell, and a selection transistor TS.

The matrix 2 of cells is connected to a switch portion 4 comprising a plurality of byte switches 5, symmetrically repeated for the successive portions of the matrix 2. The memory architecture 10 has in fact a structure being symmetrical with respect to a source line SL shared by the entire matrix 2.

In particular, the cell transistors MC belonging to a same word 6 have first conduction terminals, in particular drain terminals, connected to respective selection transistors TS, second conduction terminals, in particular source terminals connected to each other and to the source line SL and control or gate terminals connected to each other and to a respective byte switch 5 of the switch portion 4.

The byte switches 5 have first conduction terminals, in particular source terminals, connected to the control gate terminals of the cell transistors MC of a same word 6, second conduction terminals, in particular drain terminals, connected to each other and to a control gate line CGT and control or gate terminals connected to the common control or gate terminals of the sensing transistors TS of the word 6 which represent the respective word lines WL. In this way, all the memory cells 3 belonging to a same word 6 are driven by a same byte switch 5.

Finally, the selection transistors TS have first conduction terminals, in particular drain terminals, connected to respective bit lines BL, second conduction terminals, in particular source terminals, connected to the cell transistors MC and control or gate terminals connected to the word lines WL.

Advantageously according to an embodiment of the invention, the memory cells 3 have accessible substrate terminals connected to a first additional line EEW. In particular, both the cell transistors MC and the selection transistors TS of the cells 3 have substrate terminals connected to this first additional line EEW.

Moreover, advantageously according to an embodiment of the invention, the byte switches 5 also have accessible substrate terminals connected to a second additional line BSW.

It is to be noted that all the byte switches 5 of a same column of the switch portion 4 have substrate terminals connected to a same second additional line BSW. Similarly, all the memory cells 3 of a same word of the matrix 2 have substrate terminals connected to a same first additional line EEW.

In particular, the matrix 2 of cells comprises insulated n-well and p-well regions realized above a deep n-well region, the memory cells 3 and the byte switches being respectively realized in a first and a second p-well region, separated from each other and connected to the first and second additional lines, EEW and BSW, respectively.

In this way it is possible to make the substrate terminals of the columns of byte switch 5 and of memory cells 3 accessible and to connect them to the additional lines EEW and BSW.

More in particular, it is possible to separately bias by means of biasing voltage having positive values the first and second p-well regions, thus avoiding at the same time a direct bias through the respective junctions of the transistors of the memory cells 3 and of the byte switches 5.

Advantageously according to an embodiment of the invention, a biasing method of the above described memory architecture 10 is then proposed suitable for reducing the stress on the elements of the matrix 2 of cells, in particular the byte switches 5 and the selection transistors TS. In particular, the method biasing, with a first positive biasing voltage value Veew, at least one first p-well of the memory architecture 10 to impose a first voltage condition onto a column of memory cells 3 of the matrix 2, and biasing, with a second positive biasing voltage value Vbsw, at least one second p-well of the memory architecture 10 to impose a second voltage condition onto a column of byte switches 5 of the matrix 2. These first and second p-wells are insulated from each other and suitable for housing, respectively, the memory cells 3 of a same word 6 and the byte switches 5 of a same column of the matrix 2.

Advantageously according to an embodiment of the invention, these first and second biasing voltage values, Veew and Vbsw, take different values during the different modifying and/or reading operations of the data contained in the memory cells 3 of the matrix 2, selected (sel) or non selected (non sel), according to the following table 2:

TABLE 2

| Line | Erasing operation | Programming operation | Reading operation |
| --- | --- | --- | --- |
| CGT sel | Ve | 0 V | Vr1 |
| CGT non sel | FLOAT | 0 V | 0 V |
| BL sel | FLOAT | Vp | Vr2 |
| BL non sel | FLOAT | FLOAT | FLOAT |
| WL sel | Ve + Vth bsw (Ve − Vbsw) | Vp + Vth sel (Vp − Veew) | Vr3 |
| WL non sel | 0 V | 0 V | 0 V |
| SL | 0 V | FLOAT | 0 V |
| BSW sel | Vbsw | 0 V | 0 V |

TABLE 2-continued

| Line | Erasing operation | Programming operation | Reading operation |
| --- | --- | --- | --- |
| BWS non sel | 0 V | 0 V | 0 V |
| EEW sel | 0 V | Veew | 0 V |
| EEW non sel | 0 V | 0 V | 0 V | being:

CGT, BL, WL and SL the control gate, bit, word and source lines respectively;

BSW and EEW the additional lines;

Ve and Vp erasing and programming voltage values, respectively;

Vth bsw(Ve-Vbsw) and Vth sel(Vp-Veew) threshold voltage values of the byte switch and selection transistors, under the erasing and programming conditions, respectively, when the biasing of the p-wells according to an embodiment of the invention is active;

Vr1, Vr2 and Vr3 reading voltage values, normally equal to about 1V, 0.8V and 5V; and Vbsw and Veew the first and the second biasing voltage values applied to the additional lines BSW and EEW in a preferred embodiment of the method according to an embodiment of the invention equal to +3V.

The word FLOAT also indicates when no biasing voltage is applied onto the corresponding line.

Advantageously according to an embodiment of the invention, during the programming, erasing and reading operations, not only the first biasing voltage value Veew and the second biasing voltage value Vbsw but all voltage values that are applied onto corresponding lines are positive or null.

The values reported on Table 2 highlight the advantages attained by the memory architecture 10 and by the biasing method according to an embodiment of the invention hereafter described in detail.

1. during a programming operation, a programming voltage with analogous value to the one used in an architecture of the known type is transferred onto the drain terminals of the selected cells 3 connected to the bit lines BL. In this case however, a potential difference—towards the substrate—is applied onto the drain junction of the selection transistor TS of the cell, such difference being reduced by an amount equal to the first biasing voltage value Veew applied onto the first additional line EEW (corresponding to the first p-well of the memory cells 3). In this way the extension of the region emptied of this drain junction is reduced in the substrate and thus also the possibility of inducing a punch-through phenomenon through the selection transistor TS which is dominated (like the reach-through) by the inverted biasing voltage of the n-p drain junction is reduced as well. Moreover, for the same reason, the possibility of breakdown of the drain junction of the selection transistor is reduced.

The voltage value applied onto the word line WL is in turn reduced, always thanks to the fact that the selection transistors TS of the cells 3 operate with body voltages generally lower and thus, being the value of the voltage to be transferred onto the drain terminal of the cell transistor MC equal, they have threshold voltages with body being lower with respect to a memory architecture realized according to the prior art.

It is possible to verify the improvements obtained in terms of voltage applied onto the word line WL of the memory architecture, Vwl, with the following formula:

$$[Vwl(\text{prior art})=Vp+Vthsel(Vp)]>[Vwl(\text{invention})=Vp+Vthsel(Vp-Veew)] \quad (1)$$

being

Vthsel the threshold voltage value of the selection transistor; and

Vp the programming voltage value.

Advantageously, during the programming, erasing and reading operations, the first biasing voltage value Veev, the second biasing voltage Vdsw and all voltage values that are applied onto corresponding lines are positive or null.

It is immediate to verify that, advantageously, the value of the neat voltage value applied onto the tunnel oxide of the memory cells 3, fundamental to generate the Fowler-Nordheim phenomenon, does not change.

Figure 3A:
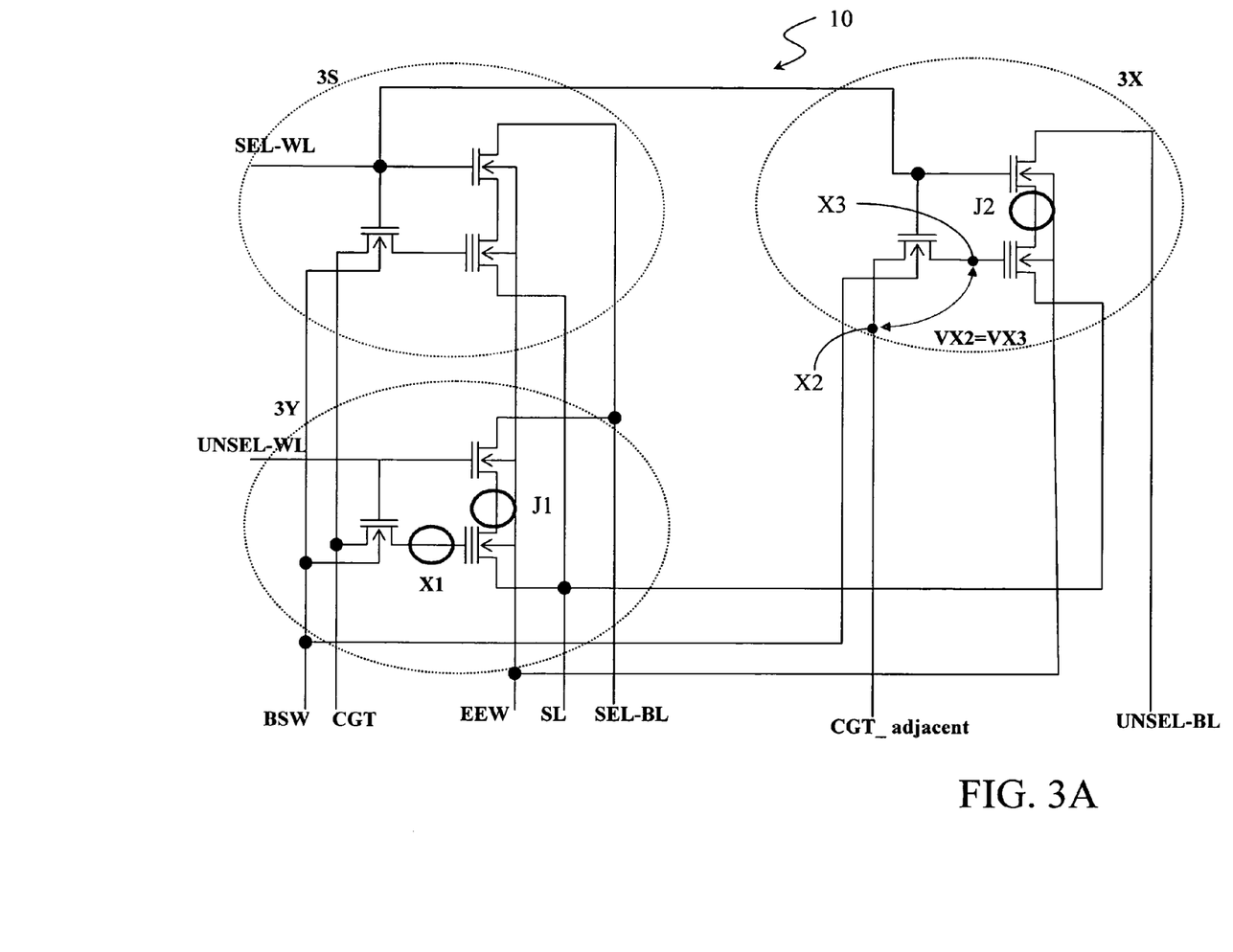
FIGS. 3A-3B schematically show circuit equivalents of the memory architecture of FIG. 2 during different operations.

FIG. 3A graphically shows the conditions of the memory architecture 10 during a programming operation, 3S indicating a memory cell selected for this operation and 3X and 3Y indicating the non-selected cells adjacent thereto in the directions X and Y of extension of the memory matrix 2.

It is easy to verify that the node X1 is under floating conditions and the nodes X2 and X3 have a same voltage value. Therefore, the junctions J1 and J2 of the non selected cells 3X and 3Y are under direct biasing conditions, the voltage values applied onto the memory architecture 10 being the following ones:

BSW™ 0V
EEW™ 3V
CGT™ 0V
SL™ ~5V
UNSEL-BL™ ~3V-0.6V
UNSEL-WL™ 0V
SEL-BL™ 11.0V
SEL-WL™ 11.0V+Vth(select)
CGT_adjacent™ 3V In this way, the cells belonging to the word line selected are subjected to a stress which is inhibited by applying a voltage value equal to 3V onto the cells of the non selected columns (signal CGT_adjacent), while the cells belonging to the same column of the selected cell 3S have drain junctions biased at a value equal to 3V-0.5V, but they are connected to a byte switch 5 which is turned off.

2. During an erasing operation, the above indicated benefits for the selection transistors of the memory cells 3 extend to the byte switches 5. In this case, the second biasing voltage value Vbsw applied onto the p-wells containing the byte switches 5 is equal to a suitable positive value which allows to decrease, in a way analogous to what has been previously discussed with reference to the selection transistors during a programming operation, the voltage value of the word line WL necessary to transfer the erasing voltage Ve onto the control gate terminals of the memory cells 3 selected for the erasing.

All this allows a reduction of the operative voltage on the word lines also in the erasing step. The same considerations expressed in connection with the programming are thus valid.

It is also observed that the new configuration proposed for the memory architecture 10 has a direct biasing of the drain junctions of the byte switches 5 belonging to words 6 non-selected for the erasing, which share, however, the same biasing of the second additional line BSW. A positive voltage is then transferred onto the control gate terminals also of these non selected memory cells 3 which will be in the order of:

$$VCGT(\text{unsel}) = Vbsw - Vj \quad (5)$$

Vj being the potential drop for the directly biased junction.

This disturbance, which occurs only during the erasing step with control gate terminals being biased with a voltage of about 3V and drain terminals of the memory cells 3 non selected to ground, is however less efficient than the one which could occur in the reading step, since the erasing times are definitely shorter than the reading times.

Figure 3B:
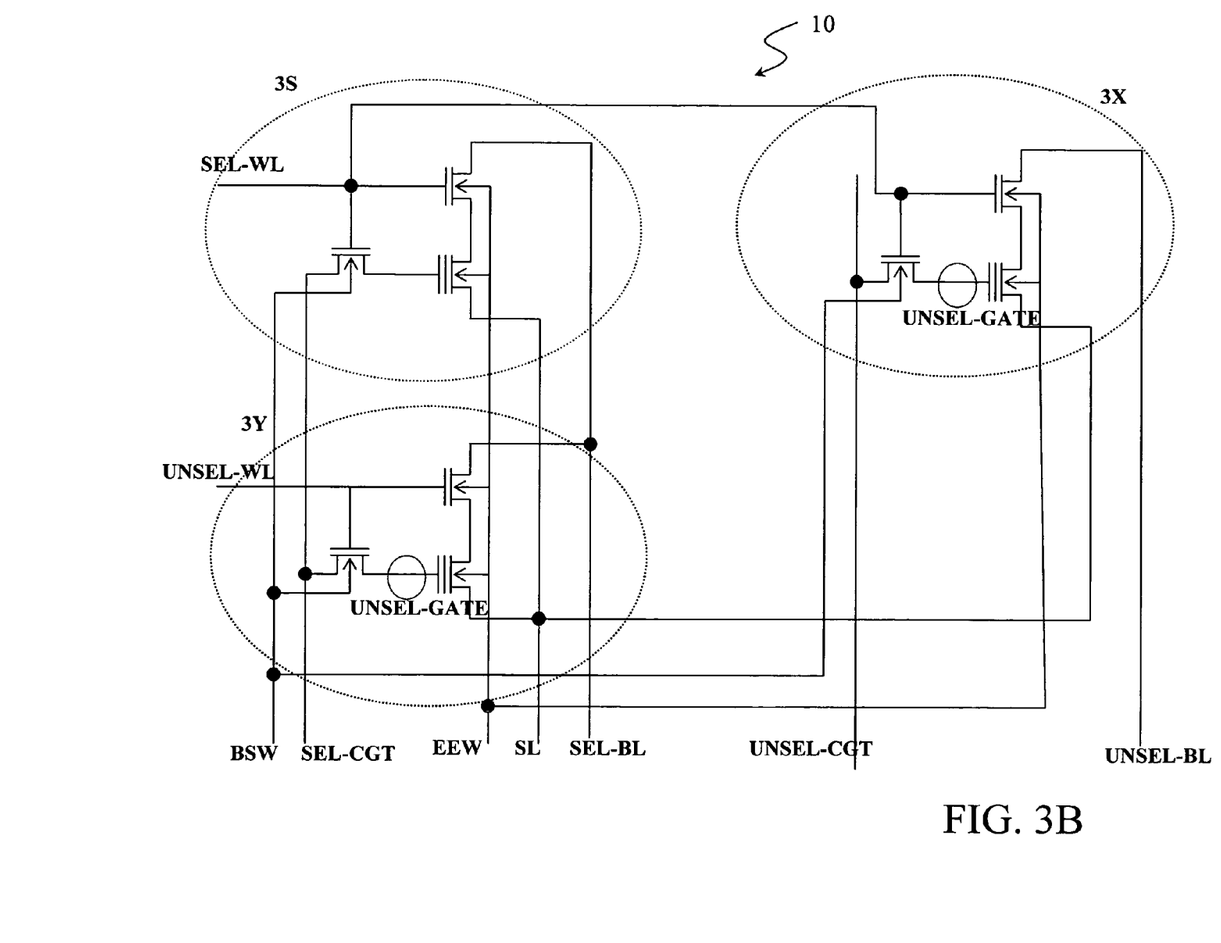

FIG. 3B graphically show the conditions of the memory architecture 10 during an erasing operation, 3S indicating a memory cell selected for this operation and 3X and 3Y indicating the non selected cells adjacent thereto in the directions X and Y of extension of the memory matrix 2.

In this case, on the gate terminals of the non selected cells (UNSEL-GATE) a positive voltage value is induced, but no biasing of the drain terminals occurs, the voltage values applied onto the memory architecture 10 being the followings ones:

BSW™ 3V
EEW™ 0V
SEL-CGT™ 12.25V
UNSEL-CGT™ 3V-0.6V(float)
SL™ 0V
UNSEL-BL™ 0V
UNSEL-WL™ 0V
SEL-BL™ 0V
SEL-WL™ 12.25V+Vth(select)
UNSEL-GATE™ 3V-0.6V The memory architecture 10 according to an embodiment of the invention is advantageously applied in devices of the Smart Card type.

As it is well known, a Smart Card is a microprocessor device to be inserted into a body or casing of the credit card type. Smart Cards are very popular and used for different applications such as:

in the credit cards and in cash dispensers;
as access means to computerized safety systems;
in wireless communications;
as trading stamp collection cards;
for banking communications;
as activation means of television decoders; and
for the transmission of fiscal data.

In substance, Smart Cards are used in combination with a reader connected to a personal computer to authenticate the connection of a user. The use of communication Smart Card systems is also known to improve the safety of transactions carried out on the Internet.

Essentially, a Smart Card device comprises a non volatile memory connected to a microprocessor which is requested to manage two-way communications between the device and the exterior, for the data questioning and modification, everything in a safe way, for example by using suitable cryptography algorithms as well as anti-fraud procedures.

Advantageously according to an embodiment of the invention, a device of the Smart Card type is proposed comprising at least one casing housing a microprocessor connected to a memory device, this memory device being realized by means of a memory architecture 10 as above described. Such a smart card can be utilized in a variety of different types of electronic systems depending on the specific type of application as mentioned above. Accordingly, these electronic systems include banking systems including cash dispensers such as ATMs, computer systems, wireless communications systems, trading stamp collection card systems television systems, and so on, as will be appreciated by those skilled in the art.

In conclusion, the memory architecture 10 and the biasing method according to an embodiment of the invention allow attaining the following advantages:

possibility of reducing the insulation between the bit lines BL (and thus the space between the active areas of the elements of the memory matrix 2);

possibility of reducing the dimensions (width W and length L) of the selection transistor TS of the memory cells 3, keeping the gain unaltered;

possibility of limiting the voltage values applied onto the junctions of the selection transistors TS and of the byte switches 5, as well as onto the tunneling junction (drain) of the cell transistor MC;

possibility of limiting the voltage values onto the gate oxide of the selection transistors and of the byte switches 5;

possibility of reducing the voltage maximum values generated on the word lines WL and thus of regulating the relative high voltage pumps (HV) to lower voltages;

possibility of reducing the thickness of the oxides of the high voltage transistors (HV) in peripheral portions of the memory architecture 10, in particular the transistors used for the generation and the management of the modify voltages, and also in the matrix 2 of cells; and use of positive voltages only which can be generated starting from a single high voltage pump (HV), as in the known architectures (thus maintaining the realization simplicity of the proposed architecture).

In substance, the memory architecture 10 and the biasing method according to embodiments of the invention allow to scale down the dimensions of the memory cells 3 below the physical limit allowed by the known architectures, keeping unaltered the simplicity of the memory matrix 2 management, having to generate in any case only positive voltages. Moreover, advantageously, it is possible to scale down the dimensions of the high voltage transistors (HV) used by the memory architecture 10, by reducing both the thickness of the oxides and the channel lengths.

Finally, it is suitable to underline the fact that the memory architecture 10 according to an embodiment of the invention shows reduced absorption caused by leakage currents thanks to the possibility of limiting the voltage values applied onto the junctions in the matrix 2 (select and cell transistors).

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A memory architecture of the type comprising at least one matrix of memory cells of the EEPROM type organized in rows or word lines and columns or bit lines, each memory cell comprising a floating gate cell transistor and a selection transistor and being connected to a source line shared by the matrix, the memory cells being organized in words, all the memory cells belonging to a same word being driven by a byte switch, in turn connected to at least one control gate line wherein the memory cells have accessible substrate terminals connected to a first additional line, and wherein the byte switches have accessible substrate terminals connected to a second additional line, and wherein a first biasing voltage applied to the first additional line and a second biasing voltage applied to the second additional line have different values during different operational modes of the memory architecture.

2. The memory architecture of claim 1, wherein both the cell transistors and the selection transistors of the memory cells have substrate terminals connected to the first additional line.

3. The memory architecture of claim 1, wherein the memory cells connected to the first additional line belong to a same word of the matrix.

4. The memory architecture of claim 1, wherein the byte switches having substrate terminals connected to the second additional line are connected to memory cells belonging to a same column of the matrix.

5. The memory architecture of claim 1, wherein the memory cells having substrate terminals connected to the first additional line are realized in a first p-well region connected to the first additional line.

6. The memory architecture of claim 5, wherein the byte switches having substrate terminals connected to the additional line are realized in a second p-well region connected to the second additional line.

7. The memory architecture of claim 6, wherein the first and second p-well regions are separated from each other.

8. The memory architecture of claim 7, wherein the first and second p-well regions are separated from each other by n-well regions, the p-well and n-well regions being realized above a deep n-well region.

9. A biasing method of a memory architecture of the type comprising at least one matrix of memory cells of the EEPROM type organized in rows or word lines and columns or bit lines, each memory cell comprising a floating gate cell transistor and a selection transistor and being connected to a source line shared by the matrix, the memory cells being organized in words, all the memory cells belonging to a same word being connected to a byte switch, in turn connected to at least one control gate line, the method comprising the steps of:

realizing the memory cells in a first p-well region connected to a first additional line;

realizing the byte switches in a second p-well region connected to a second additional line;

biasing with a first biasing voltage value the first p-well well; and biasing with a second biasing voltage value the second p-well well, the first and second p-well wells being insulated from each other, and wherein the first and second biasing voltage values take different values during the different operational modes the memory architecture.

10. A biasing method of a memory architecture of the type comprising at least one matrix of memory cells of the EEPROM type organized in rows or word lines and columns or bit lines, each memory cell comprising a floating gate cell transistor and a selection transistor and being connected to a source line shared by the matrix, the memory cells being organized in words, all the memory cells belonging to a same word being connected to a byte switch, in turn connected to at least one control gate line, the method comprising the steps of:

realizing the memory cells in a first p-well region connected to a first additional line;

realizing the byte switches in a second p-well region connected to a second additional line;

biasing with a first biasing voltage value the first p-well well; and biasing with a second biasing voltage value the second p-well well, the first and second p-well wells being insulated from each other, and wherein the first and second biasing voltage values take different values during the different operations of erasing, programming and reading the data contained in the memory cells of the matrix, according to the following scheme:

| Line | Erasing operation | Programming operation | Reading operation |
|---|---|---|---|
| CGT sel | Ve | 0 V | Vr1 |
| CGT non sel | FLOAT | 0 V | 0 V |
| BL sel | FLOAT | Vp | Vr2 |
| BL non sel | FLOAT | FLOAT | FLOAT |
| WL sel | Ve + Vth bsw (Ve − Vbsw) | Vp + Vth sel (Vp − Veew) | Vr3 |
| WL non sel | 0 V | 0 V | 0 V |
| SL | 0 V | FLOAT | 0 V |
| BSW sel | Vbsw | 0 V | 0 V |
| BWS non sel | 0 V | 0 V | 0 V |
| EEW sel | 0 V | Veew | 0 V |
| EEW non sel | 0 V | 0 V | 0 V | being:

CGT, BL, WL and SL the control gate, bit, word and source lines respectively;

BSW and EEW the first and second additional lines;

Ve and Vp erasing and programming values, respectively;

Vth bsw(Ve-Vbsw) and Vth sel(Vp-Veew) threshold voltage values of the byte switches and of the selection transistors, under the erasing and programming conditions, respectively;

Vr1, Vr2 and Vr3 reading voltage values;

Vbsw and Veew the first and second biasing voltage values applied to the first and second additional lines; and FLOAT indicating when no biasing voltage is applied onto a corresponding line, sel and non sel indicating if the memory cells are selected or non selected for the operation.

11. The biasing method of the claim 10 wherein, during the different operations of erasing, programming and reading, the first and second biasing voltage values and all voltage values that are applied onto corresponding lines are positive or null.

12. A Smart Card device of the type comprising:
at least one casing housing a microprocessor connected to a memory device, wherein the memory device is a memory architecture of the type comprising.
at least one matrix of memory cells of the EEPROM type organized in rows or word lines and columns or bit lines, each memory cell comprising a floating gate cell transistor and a selection transistor and being connected to a source line shared by the matrix, the memory cells being organized in words, all the memory cells belonging to a same word being driven by a byte switch, in turn connected to at least one control gate line,
wherein the memory cells have accessible substrate terminals connected to a first additional line,
wherein the byte switches have accessible substrate terminals connected to a second additional line, and
wherein a first biasing voltage applied to the first additional line and a second biasing voltage applied to the second additional line have different values during different operational modes of the memory device.

13. The Smart Card device of claim 12, wherein both the cell transistors and the selection transistors of the memory cells have substrate terminals connected to the first additional line.

14. The Smart Card device of claim 12, wherein the memory cells connected to the first additional line belong to a same word of the matrix.

15. The Smart Card device of claim 12, wherein the byte switches having substrate terminals connected to the second additional line are connected to memory cells belonging to a same column of the matrix.

16. The Smart Card device of claim 12, wherein the memory cells having substrate terminals connected to the first additional line are realized in a first p-well region connected to the first additional line.

17. The Smart Card device of claim 12, wherein the byte switches having substrate terminals connected to the additional line are realized in a second p-well region connected to the second additional line.

18. The Smart Card device of claim 17, wherein the first and second p-well regions are separated from each other.

19. The Smart Card device of claim 18, wherein the first and second p-well regions are separated from each other by n-well regions, the p-well and n-well regions being realized above a deep n-well region.

20. A memory architecture of the type comprising:
a matrix of memory cells of the EEPROM type organized in rows or word lines and columns or bit lines, each memory cell comprising a floating gate cell transistor and a selection transistor and being connected to a source line shared by the matrix,
a plurality of byte switch connected to the memory cells in such a way that all the memory cells belonging to a same word are driven by a same byte switch as well as to at least one control gate line
wherein
the memory cells have accessible substrate terminals connected to a first additional line; and
the byte switches have accessible substrate terminals connected to a second additional line; and
wherein a first biasing voltage applied to the first additional line and a second biasing voltage applied to the second additional line have different values during different operational modes of the memory architecture.

21. The memory architecture of claim 20, wherein both the cell transistors and the selection transistors of the memory cells have substrate terminals connected to the first additional line.

22. The memory architecture of claim 20, wherein the memory cells connected to the first additional line belong to a same word of the matrix.

23. The memory architecture of claim 20, wherein the byte switches having substrate terminals connected to the second additional line are connected to memory cells belonging to a same column of the matrix.

24. The memory architecture of claim 20, wherein the memory cells having substrate terminals connected to the first additional line are realized in a first p-well region connected to the first additional line.

25. The memory architecture of claim 20, wherein the byte switches having substrate terminals connected to the additional line are realized in a second p-well region connected to the second additional line.

26. The memory architecture of claim 25, wherein the first and second p-well regions are separated from each other.

27. The memory architecture of claim 26, wherein the first and second p-well regions are separated from each other by n-well regions, the p-well and n-well regions being realized above a deep n-well region.

28. A memory device, comprising:
a matrix of non-volatile memory cells organized in rows and columns, each memory cell comprising a floating gate cell transistor and a selection transistor and being connected to a source line shared by the matrix, the memory cells being organized in words;
a byte switch coupled to each word of memory cells, each being connected to at least one control gate line; and
wherein the memory cells have accessible substrate terminals connected to a first additional line;
wherein each byte switch includes transistors having accessible substrate terminals connected to a second additional line; and
wherein a first biasing voltage applied to the first additional line and a second biasing voltage applied to the second additional line have different values during different operational modes of the memory architecture.

29. The memory device of claim 28 wherein the non-volatile memory cells comprise EEPROM memory cells.

30. An electronic system, comprising:
electronic circuitry operable to perform a desired function; and
a smart card configured to interface with the electronic circuitry, the smart card including,
a processor coupled to the electronic circuitry;
a memory device coupled to the processor, the memory device including,
a matrix of non-volatile memory cells organized in rows and columns, each memory cell comprising a floating gate cell transistor and a selection transistor and being connected to a source line shared by the matrix, the memory cells being organized in words;
a byte switch coupled to each word of memory cells, each being connected to at least one control gate line; and
wherein the memory cells have accessible substrate terminals connected to a first additional line;
wherein each byte switch includes transistors having accessible substrate terminals connected to a second additional line; and
wherein a first biasing voltage applied to the first additional line and a second biasing voltage applied to the second additional line have different values during different operational modes of the memory architecture.

31. The electronic system of claim 30 wherein the electronic circuitry comprises one of a banking system, a computer system, a wireless communications system, a trading stamp collection card system, a television system.

32. A method of accessing memory cells in a matrix of memory cells arranged in rows and columns, the memory cells being arranged in words with each word being coupled to an associated byte switch, each memory cell and each byte switch including transistors having substrates and the method comprising:
biasing with a first biasing voltage the substrates of the transistors in the memory cells; and
biasing with a second biasing voltage the substrates of the transistors in the bytes switches, the first and second biasing voltages having different values during different operational modes of the matrix of memory cells.

33. The memory architecture of claim 1 wherein the different operational modes of the memory architecture include erasing, programming and reading the data contained in the memory cells of the matrix.

* * * * *

UNITED STATES PATENT AND TRADEMARK OFFICE
CERTIFICATE OF CORRECTION

| | |
|---|---|
| PATENT NO. | : 7,649,786 B2 |
| APPLICATION NO. | : 11/701165 |
| DATED | : January 19, 2010 |
| INVENTOR(S) | : Antonino Conte et al. |

It is certified that error appears in the above-identified patent and that said Letters Patent is hereby corrected as shown below:

- On the title page item (75), inventor "Roerto Annunziata" should read --Roberto Annunziata--.

- In Claim 10, Column 11, Line 13 of the patent, "BWS non sel" should read --BSW non sel--.

- In Claim 20, Column 12, Line 25 of the patent, "a plurality of byte switch" should be changed to --a plurality of byte switches--.

- In Claim 31, Column 14, Line 14 of the patent, --and-- should be inserted before the words "the television system".

- In Claim 32, Column 14, Line 24 of the patent, "the bytes switches" should be changed to --the byte switches--.

Signed and Sealed this

Twenty-seventh Day of April, 2010

David J. Kappos
*Director of the United States Patent and Trademark Office*